US006949468B2

United States Patent
Lee et al.

(10) Patent No.: US 6,949,468 B2
(45) Date of Patent: Sep. 27, 2005

(54) METHOD OF PREVENTING CATHODE OF ACTIVE MATRIX ORGANIC LIGHT EMITTING DIODE FROM BREAKING

(75) Inventors: Hsin-Hung Lee, Taipei (TW); Chih-Hung Su, Kaohsiung (TW); Yi Sheng Cheng, Kaohsiung (TW)

(73) Assignee: Au Optronics Corporation, Hsinchu (TW)

( * ) Notice: Subject to any disclaimer, the term of this patent is extended or adjusted under 35 U.S.C. 154(b) by 46 days.

(21) Appl. No.: 10/248,990

(22) Filed: Mar. 7, 2003

(65) Prior Publication Data

US 2003/0224547 A1 Dec. 4, 2003

Related U.S. Application Data

(62) Division of application No. 10/064,382, filed on Jul. 9, 2002, now abandoned.

(30) Foreign Application Priority Data

May 30, 2002 (TW) ........................................ 91111520 A

(51) Int. Cl.⁷ ............................................. H01L 21/302
(52) U.S. Cl. ....................................................... 438/713
(58) Field of Search .......................... 349/43, 30, 82, 349/161, 706–713, 745–754; 438/30, 82, 161, 706–713, 745–754

(56) References Cited

U.S. PATENT DOCUMENTS

| | | | | |
|---|---|---|---|---|
| 4,350,563 A | * | 9/1982 | Takada et al. | 438/694 |
| 4,620,208 A | * | 10/1986 | Fritzsche et al. | 257/58 |
| 5,559,399 A | * | 9/1996 | Tanski et al. | 313/506 |
| 5,846,884 A | * | 12/1998 | Naeem et al. | 438/714 |
| 6,255,705 B1 | * | 7/2001 | Zhang et al. | 257/412 |
| 6,335,290 B1 | * | 1/2002 | Ishida | 438/705 |

* cited by examiner

*Primary Examiner*—David Nelms
*Assistant Examiner*—Calvin Lee
(74) *Attorney, Agent, or Firm*—Jiang Chyun IP Office

(57) ABSTRACT

A method of preventing the cathode of an active matrix organic light emitting diode from breaking. A substrate having an array of thin film transistors thereon is provided. Each thin film transistor includes a gate electrode, a channel layer, a source terminal and a drain terminal. A passivation layer is formed over the substrate and then the passivation layer is planarized. Thereafter, an opening that exposes the drain terminal is formed in the passivation layer. An anode layer is formed over the passivation layer and the interior of a portion of the opening so that the drain terminal and the anode layer are electrically connected. A light-emitting layer and a cathode layer are sequentially formed over the substrate to form an active matrix organic light emitting device.

2 Claims, 6 Drawing Sheets

METHOD OF PREVENTING CATHODE OF ACTIVE MATRIX ORGANIC LIGHT EMITTING DIODE FROM BREAKING

CROSS REFERENCE TO RELATED APPLICATIONS

This application is a divisional application of, and claims the priority benefit of, U.S. application Ser. No. 10/064,382 filed on Jul. 09, 2002, which is now abandoned.

BACKGROUND OF INVENTION

1. Field of Invention

The present invention relates to a method of manufacturing an active matrix organic light emitting diode (OLED). More particularly, the present invention relates to a method of preventing the cathode of an active matrix organic light emitting diode from breaking.

2. Description of Related Art

Organic light emitting diode (OLED) is a semiconductor device capable of converting electrical energy into light energy with a high conversion efficiency. The most common applications include indicator lights, display panels and optical pick up heads. Because OLED has some special properties such as wide viewing angle, ease of manufacture, low production cost, high response speed, wide range of operating temperature and full coloration, OLED is a suitable candidate for forming multimedia display devices.

At present, the active matrix type of OLED is being rapidly developed. In the following, a method of manufacturing a conventional active matrix OLED is described. FIG. 1 is a schematic cross sectional view showing the structure of a conventional active matrix OLED.

A conventional active matrix OLED as shown in FIG. 1 is formed in several steps. First, a gate electrode 102 is formed over a substrate 100 and then a gate insulation layer 104 is formed over the substrate 100 and the gate electrode 102. A channel layer 106 is formed on the gate insulation layer 104 above the gate electrode 102. Thereafter, a drain terminal 108a and a source terminal 108b are formed over the channel layer 106 to form a thin film transistor.

A passivation layer 110 is formed over the substrate 100 covering the thin film transistor. An opening 112 that exposes the source terminal 108b is formed in the passivation layer 110. Thereafter, an anode layer 114 is formed over the passivation layer 110 and the interior of a portion of the opening 112 so that the anode layer 114 and the source terminal 108b are electrically connected. A light-emitting layer 116 and a cathode 118 are sequentially formed over the substrate 100. Ultimately, an active matrix organic light emitting diode is formed over the substrate 100.

In a conventional method of forming an active matrix OLED, both the organic layer 116 and the cathode layer 118 are formed over the thin film transistor structure and the anode layer 114 through an evaporation-deposition process. However, step coverage capacity of the organic layer 116 and the cathode layer 118 is poor. Hence, sharp corners 120 within the thin film transistor structure such as the ones at each end of the source/drain 108a/108b may break or form a discontinuity after forming the organic layer 116 and the cathode layer 118. When the anode layer 118 is discontinuous or has a break, current conduction within the device as well as emissive power of the device is severely affected.

SUMMARY OF INVENTION

Accordingly, one object of the present invention is to provide a method of preventing the cathode of an active matrix organic light emitting diode from breaking so that the current conduction and light-emitting mechanism can operate normally.

To achieve these and other advantages and in accordance with the purpose of the invention, as embodied and broadly described herein, the invention provides a method of preventing the cathode of an active matrix organic light emitting diode from breaking. The method includes the following manufacturing steps. A substrate having an array of thin film transistors thereon is provided. Each thin film transistor includes a gate electrode, a channel layer, a source terminal and a drain terminal. A passivation layer made from a material such as an electric resin is formed over the substrate. The passivation layer is planarized. Thereafter, an opening that exposes the drain terminal is formed in the passivation layer. An anode layer is formed over the passivation layer and the interior of a portion of the opening so that the drain terminal and the anode layer are electrically connected. A light-emitting layer and a cathode layer are sequentially formed over the substrate to form an active matrix organic light emitting device.

This invention also provides a second method of preventing the cathode of an active matrix organic light emitting diode from breaking. The method includes the following manufacturing steps. A substrate having an array of thin film transistors and a corresponding anode layer for each thin film transistor is provided. Each thin film transistor includes a gate electrode, a channel layer, a source terminal and a drain terminal. The anode layer and the source terminal are electrically connected. A patterned passivation layer is formed over the substrate covering the thin film transistors but exposing a large portion of the anode layer. A patterned photosensitive material layer is formed over the substrate covering the passivation layer, thereby planarizing the passivation layer. The same photomask is used for patterning the photosensitive material layer and the passivation layer. A light emitting layer and a cathode layer are sequentially formed over the photosensitive layer and the anode layer to form an active matrix organic light emitting diode device.

This invention also provides a third method of preventing the cathode of an active matrix organic light emitting diode from breaking. This method includes rounding off the corners of the source/drain terminal of a thin film transistor. A conductive layer is fromed over a substrate. The conductive layer is a three-layered stack such as a molybdenum/aluminum/molybdenum stack. A patterned photoresist layer is formed over the conductive layer. A dry etching operation is conducted using the photoresist layer as an etching mask to form a pattern for forming the source/drain terminals of a thin film transistor. The source/drain pattern has a slanting profile close to each end. The dry etching operation uses a reactive gas such as a mixture of sulfur hexafluoride ($SF_6$) and oxygen ($O_2$) or a mixture of chlorine ($Cl_2$) and boron chloride ($BCl_3$). The ratio SF6/O2 is about 0.5~1.0 and Cl2/BCl3 is about 0.4~0.8. Finally, the photoresist layer is removed. Since the source/drain pattern has a sloping profile at each end, subsequently formed cathode layer over the conductive layer is less vulnerable to break.

This invention also provides a fourth method of preventing the cathode of an active matrix organic light emitting diode from breaking. This method includes rounding off the corners of the source/drain terminal of a thin film transistor. A conductive layer is formed over a substrate. A patterned first photoresist layer is formed over the conductive layer. A first etching operation is conducted using the first photoresist layer as an etching mask so that a definite thickness of the conductive layer is removed. An ashing operation is carried out to remove a definite thickness of the first photoresist layer to form a second photoresist layer. A second etching operation is carried out using the second photoresist layer as an etching mask to form the source/drain pattern of a thin film transistor. The source/drain pattern has a sloping profile at each end. Finally, the second photoresist layer is removed. Since the source/drain pattern has a sloping profile at each end, subsequently formed cathode layer over the conductive layer is less vulnerable to break.

This invention also provides a fifth method of preventing the cathode of an active matrix organic light emitting diode from breaking. This method includes rounding off the corners of the source/drain terminal of a thin film transistor. A conductive layer is formed over a substrate. A photoresist layer is formed over the conductive layer. Using the photoresist layer as an etching mask, the source/drain pattern of a thin film transistor is formed. The etching operation is carried out using an etchant such as $HNO_3/H_3PO_4/CH_3COOH$ (nitric acid/phosphoric acid/acetic acid), where the weight percentage of HNO3 in the etchant is between 0.1~0.2. Since the concentration of HNO3 in the etchant is relative high, the etching rate with respect to the interface is higher. Consequently, sharp corners near the ends of source/drain terminals are rounded and subsequently formed cathode layer is less vulnerable to break.

This invention also provides a sixth method of preventing the cathode of an active matrix organic light emitting diode from breaking. The method includes the following manufacturing steps. A substrate having an array of thin film transistors is provided. Each thin film transistor includes a gate electrode, a channel layer, a source terminal and a drain terminal. An anode layer that corresponds to the thin film transistor is formed over the substrate. The anode layer and the source terminal of the thin film transistor are electrically connected. A light emitting layer and a cathode layer are sequentially formed over the substrate covering the thin film transistor and the anode layer. When the cathode layer has a break, a repair conductive layer is formed over the cathode layer to repair the broken cathode layer. The repair conductive layer is formed in a sputtering process, for example. In addition, the repair conductive layer is also formed by conducting a thermal evaporation-deposition or electron beam evaporation-deposition process before carrying out the sputtering operation. The repair conductive layer is made using any conductive material capable of repairing the cathode layer. Preferably, the repair conductive layer and the cathode layer are made from identical material.

This invention provides a method of preventing the cathode of an active matrix organic light emitting diode from breaking. The methods include planarizing the passivation layer, forming a photosensitive layer over the passivation layer to smooth out the surface or using a special etching method to round off the corners of source/drain terminals. All these methods are capable of preventing subsequently formed cathode layer from breaking. Furthermore, this invention also provides a method of repairing broken cathode layer so that the device may be re-used.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

First Embodiment

Figure 1:
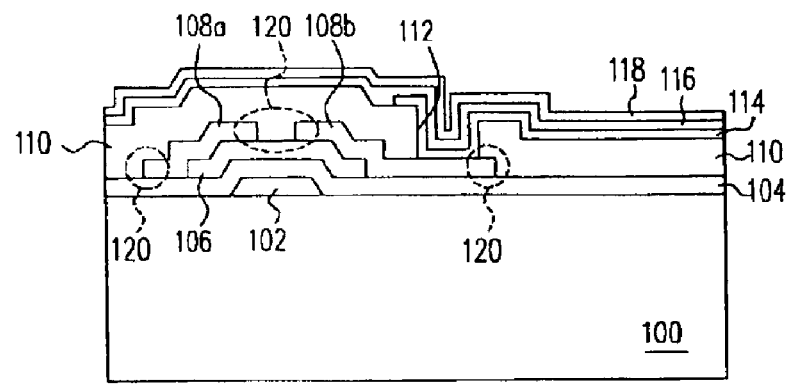
FIG. 1 is a schematic cross sectional view showing the structure of a conventional active matrix OLED.

Reference will now be made in detail to the present preferred embodiments of the invention, examples of which are illustrated in the accompanying drawings. Wherever possible, the same reference numbers are used in the drawings and the description to refer to the same or like parts.

Figure 2:
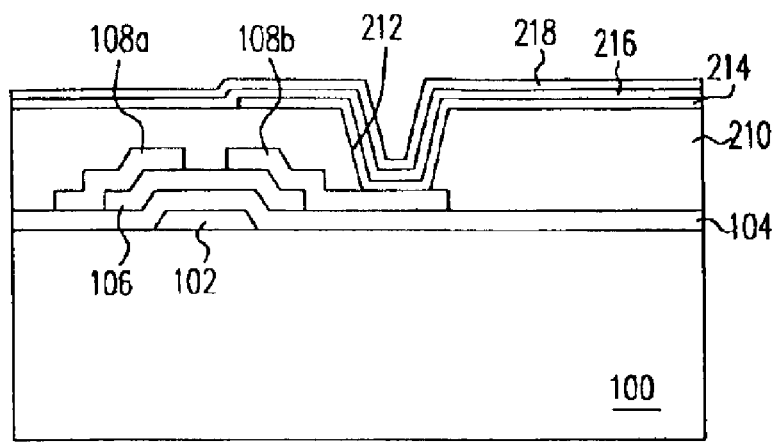
FIG. 2 is a schematic cross sectional view showing the structure of an active matrix OLED fabricated according to a first preferred embodiment of this invention.

FIG. 2 is a schematic cross sectional view showing the structure of an active matrix OLED fabricated according to a first preferred embodiment of this invention. A number of steps are required to form the active matrix OLED. First, a patterned first conductive layer 102 is formed over a substrate 100 to serve as a gate electrode. The gate electrode 102 is made of chromium, for example. A gate insulation layer 104 is formed over the substrate 100 and the gate electrode 102.

A channel layer 106 is formed over the gate electrode and the gate insulation layer 104. The channel layer 106 is an amorphous silicon layer, for example. A patterned second conductive layer 108a/108b is formed over the channel layer 106 serving as a source/drain terminal. Hence, a thin film transistor is formed.

A passivation layer 210 is formed over the substrate 100 covering the thin film transistor. The passivation layer 210 is made from a dielectric resin, for example. A planarization is carried out to flatten the upper surface of the passivation layer 210.

An opening 212 that exposes the source terminal 108b is formed in the passivation layer 210. An anode layer 214 is formed over the passivation layer 210 and the interior of a portion of the opening 212. The anode layer 214 and the source terminal 108b are electrically connected. The anode layer 214 is made from a material such as indium-tin-oxide. A light emitting layer 216 is formed over the substrate 100 covering the anode layer 214. The light emitting layer 216 is an organic compound capable of emitting light. Finally, a cathode layer 218 is formed over the light emitting layer 216 to form an active matrix organic light emitting diode device.

Since the passivation layer 210 over the thin film transistor has a planar surface, the light emitting layer 216 and the anode layer 218 formed over the passivation layer 210 can have a better step coverage. Ultimately, the probability of having a broken cathode is greatly minimized.

Second Embodiment

Figure 3:
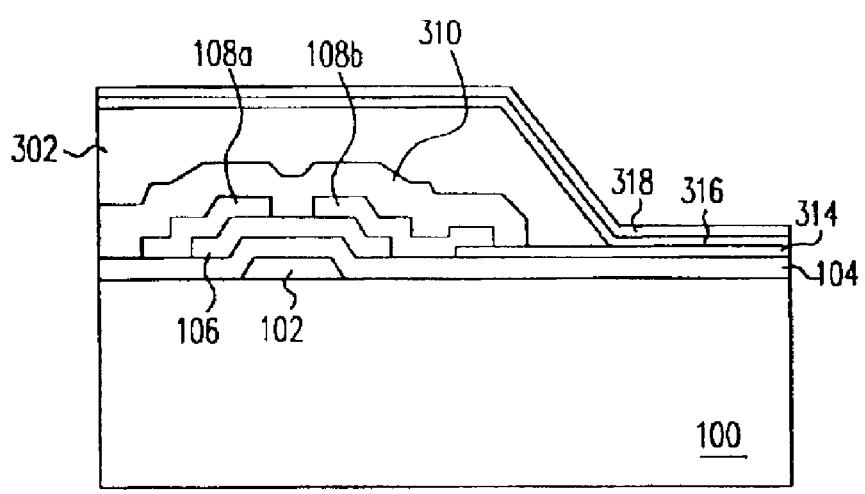
FIG. 3 is a schematic cross sectional view showing the structure of an active matrix OLED fabricated according to a second preferred embodiment of this invention.

FIG. 3 is a schematic cross sectional view showing the structure of an active matrix OLED fabricated according to a second preferred embodiment of this invention. A number of steps are required to form the active matrix OLED. First, a patterned first conductive layer 102 is formed over a substrate 100 to serve as a gate electrode. The gate electrode 102 is made of chromium, for example. A gate insulation layer 104 is formed over the substrate 100 and the gate electrode 102.

A channel layer 106 is formed over the gate insulation layer 104 above the gate electrode 102. The channel 106 is an amorphous silicon layer, for example. An anode layer 314 is formed over the gate insulation layer 104. The anode layer 314 is an indium-tin-oxide layer, for example.

A patterned second conductive layer 108a/108b is formed over the channel layer 106 and a portion of the anode layer 314 to serve as a source/drain terminal. The source terminal 108b and the anode layer 314 are electrically connected. Hence, a thin film transistor structure is formed.

A patterned passivation layer 310 is formed over the substrate 100 covering the thin film transistor structure and a portion of the anode layer 314. The passivation layer is a silicon nitride layer, for example. Thereafter, a photosensitive material layer is formed over the substrate 100 to smooth out the upper surface of the passivation layer 310. A photolithographic processing is conducted so that the photosensitive material layer 302 only covers the passivation layer 310 and exposes the anode layer 314.

A light emitting layer 316 is formed over the substrate 100 covering the photosensitive material layer 302 and the anode layer 314. The light emitting layer 316 is made from an organic compound capable of producing light. Thereafter, a cathode layer 318 is formed over the light emitting layer 316 to form an active matrix organic light emitting diode device.

In the second embodiment of this invention, the uneven upper surface of the passivation layer 310 is smoothed out by the photosensitive material layer 302. Therefore, the light emitting layer 316 and the anode layer 318 formed over the photosensitive material layer 302 can have a better step coverage. Ultimately, probability of having a broken cathode is greatly minimized.

Third Embodiment

One major reason for creating a broken cathode layer in an active matrix organic light emitting diode is the sharp corners at each end of a source/drain terminal inside the thin film transistor. These sharp corners often break up subsequently formed cathode layer. Hence, to prevent a broken cathode layer, a direct method is to round off any sharp corners in the source/drain terminals.

Figure 4A:
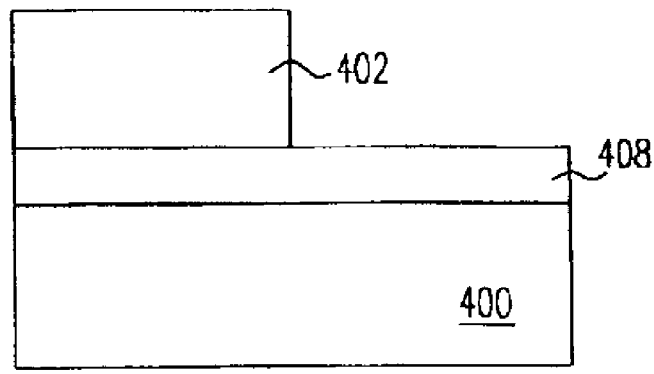
FIGS. 4A to 4C are schematic cross-sectional views showing the steps for forming an active matrix OLED that prevents cathode breakage according to a third preferred embodiment of this invention.
Figure 4B:
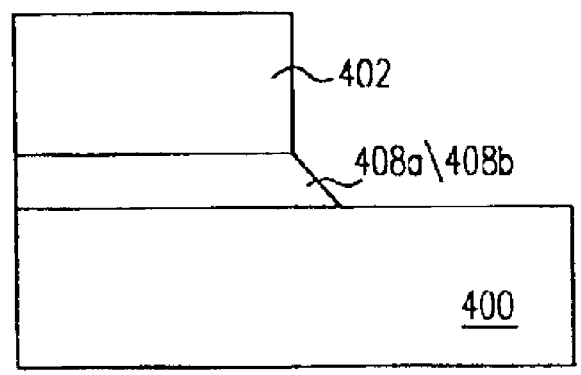
Figure 4C:
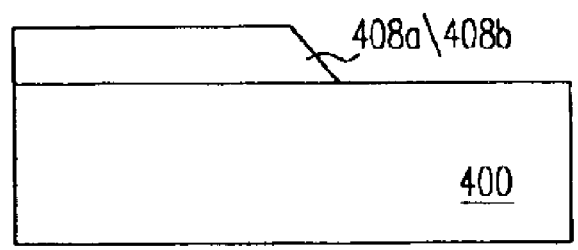

FIGS. 4A to 4C are schematic cross-sectional views showing the steps for forming an active matrix OLED that prevents cathode breakage according to a third preferred embodiment of this invention. As shown in FIG. 4A, a conductive layer 408 is formed over a substrate 400. The conductive layer is a three-layered composite stack such as a titanium/aluminum/titanium composite layer, or a molybdenum layer. A patterned photoresist layer 402 is formed over the conductive layer 408 covering the designated source/drain terminal.

As shown in FIG. 4B, a dry etching operation is carried out using the photoresist layer 402 as an etching mask to form a source/drain terminal 408a/408b pattern. Each end of the pattern has a sloping profile. The dry etching operation uses a reactive gas such as a mixture of sulfur hexafluoride ($SF_6$) and oxygen ($O_2$) or a mixture of chlorine ($Cl_2$) and boron chloride ($BCl_3$). The ratio of $SF_6/O_2$ or $Cl_2/BCl_3$ is adjusted to optimize the sideward etching rate of the photoresist layer 402 and the conductive layer 408. Consequently, a sloping profile is obtained at the end of the source/drain pattern 408a/408b. In this invention, the $SF_6/O_2$ ratio is about 0.5~1.0 and the $Cl_2/BCl_3$ is about 0.4~0.8, for example.

As shown in FIG. 4C, the photoresist layer 402 is removed. Thereafter, various films constituting an active matrix organic light emitting diode device such as a passivation layer, an anode layer, a light emitting layer and a cathode layer are sequentially formed over the substrate 400. Since these films are formed by conventional processes, detailed description is omitted.

In this embodiment, sharp corners in the source/drain pattern are rounded using a special etching method. Hence, a broken cathode inside the active matrix organic light emitting diode device is prevented.

Figure 5A:
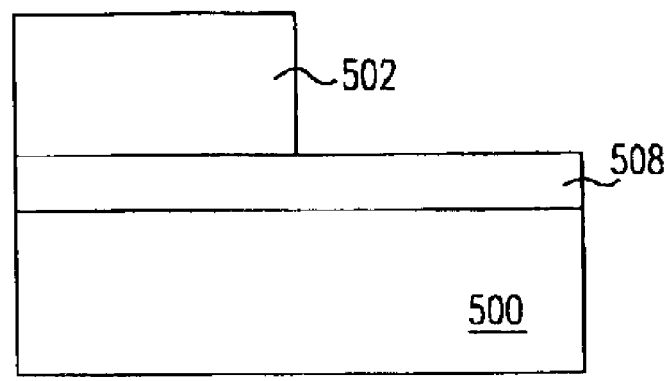
FIGS. 5A to 5D are schematic cross-sectional views showing alternative steps for forming an active matrix OLED that prevent cathode breakage according to the third preferred embodiment of this invention.

FIGS. 5A to 5D are schematic cross-sectional views showing alternative steps for forming an active matrix OLED that prevents cathode breakage according to the third preferred embodiment of this invention. As shown in FIG. 5A, a conductive layer 508 is formed over a substrate 500. A patterned photoresist layer 502 is formed over the conductive layer 508 covering the designated regions for forming source/drain terminals.

Figure 5B:
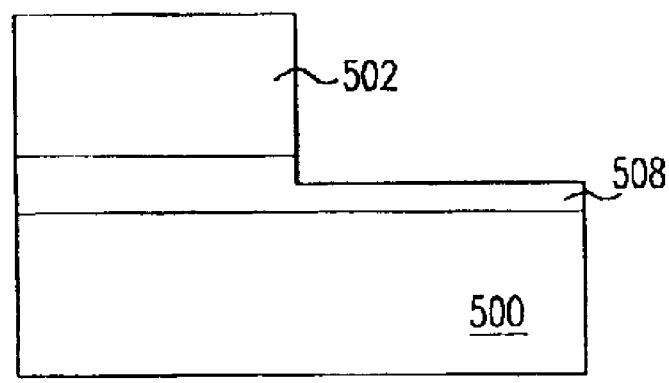

As shown in FIG. 5B, an etching operation is carried out using the photoresist layer 502 as an etching mask to remove a definite thickness of the conductive layer 508.

Figure 5C:
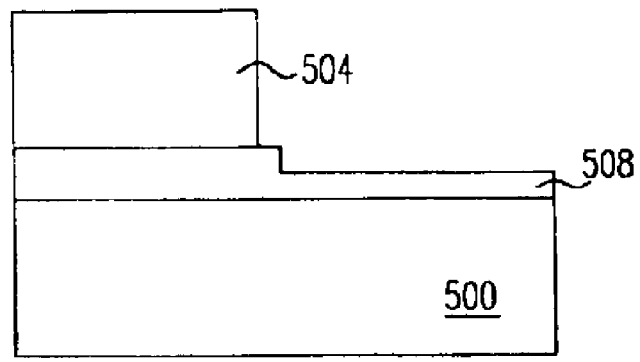
Figure 5D:
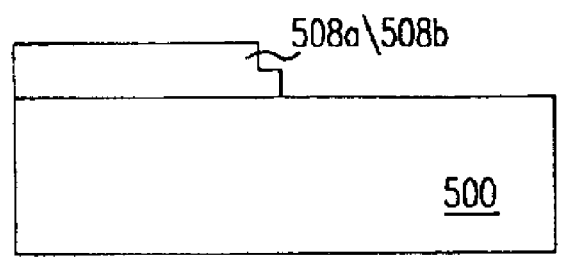

As shown in FIGS. 5C and 5D, an ashing operation is carried out to remove a definite thickness of the photoresist layer 502, thereby forming a photoresist layer 504. Thereafter, an etching operation is conducted using the photoresist layer 504 as an etching mask to form a source/drain pattern 508a/508b. Each end of the source/drain pattern 508a/508b has a sloping profile. Finally, the photoresist layer 504 is removed.

Thereafter, various films constituting an active matrix organic light emitting diode device such as a passivation layer, an anode layer, a light emitting layer and a cathode layer are sequentially formed over the substrate 500. Since these films are formed by conventional processes, detailed description is omitted.

In this embodiment, sharp corners in the source/drain pattern are rounded using a special etching method. Hence, a broken cathode inside the active matrix organic light emitting diode device is prevented.

Another special etching method that can minimize the probability of having a broken cathode inside the active matrix organic light emitting diode device is to increase concentration of $HNO_3$ in the etchant in the source/drain terminal etching process, so that the etching rate at the interface can be increased Thus, corners of source/drain terminals are rounded and subsequently formed cathode layer is less vulnerable to breakage. The following is a detailed description of the process.

In the process of etching a conductive layer over a substrate to form a source/drain pattern, concentration of $HNO_3$ in the etchant is increased. In this embodiment, an etchant such as $HNO_3/H_3PO_4/CH_3COOH$ (nitric acid/phosphoric acid/acetic acid), where the weight percentage of $HNO_3$ in the etchant is between about 0.10~0.2. Ultimately, the process averts any possible break in subsequently formed cathode layer within the active matrix organic light emitting diode device.

Fourth Embodiment

This invention also provides a method of repairing a broken cathode inside an active matrix organic light emitting diode device. When a broken cathode is found, the following method may be used to repair the device so that the device can be reused.

Figure 6A:
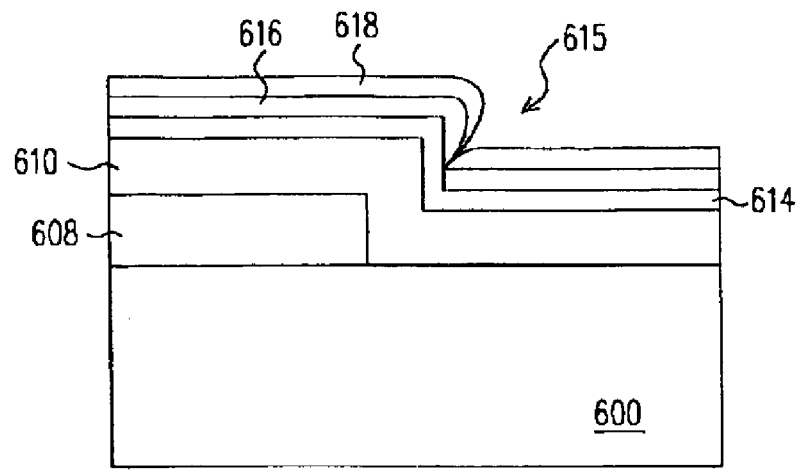
FIGS. 6A and 6B are schematic cross-sectional views showing the steps for forming an active matrix OLED that prevent cathode breakage according to a fourth preferred embodiment of this invention.
Figure 6B:
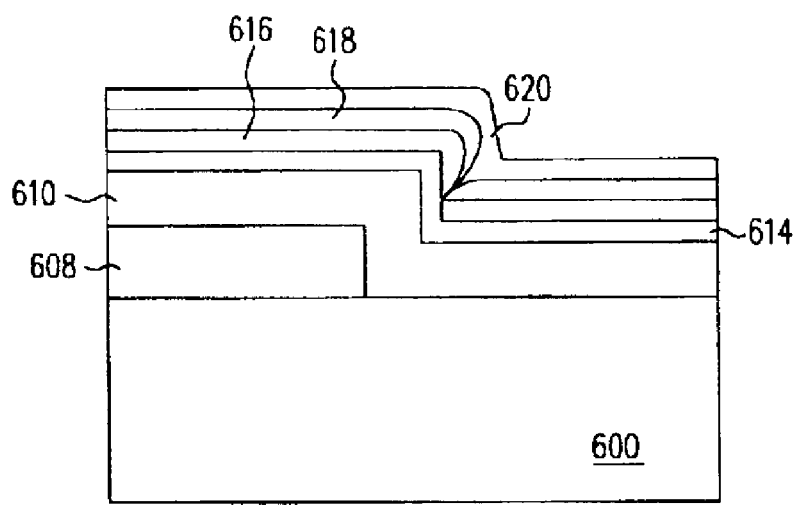

FIGS. 6A and 6B are schematic cross-sectional views showing the steps for forming an active matrix OLED that prevents cathode breakage according to a fourth preferred embodiment of this invention. As shown in FIG. 6A, a substrate 600 having an active matrix organic light emitting diode thereon is provided. The active matrix organic light emitting diode includes a thin film transistor, a passivation layer 610, an anode layer 614, a light emitting layer 616 and a cathode layer 618. The thin film transistor further includes a gate electrode (not shown), a source/drain terminal 608 and a channel layer (not shown). The source/drain pattern 608 has a corner 615 at each end. Because the light emitting layer 616 and the cathode layer 618 above the source/drain pattern 608, in particular the cathode layer, have poor step coverage around the corner 615, the cathode layer 618 may have a break.

As shown in FIG. 6B, a repair operation is conducted to mend the break in the cathode layer 618. To repair the cathode layer 618, a sputtering operation is carried out to form a repair conductive layer 620 over the cathode layer 618. The repair conductive layer 620 can be any material suitable for repairing a broken cathode 618. Preferably, a metallic material identical to the cathode layer 618 is used. Since sputtering is capable of producing a layer having superior step coverage, the repair conductive layer 620 over the cathode layer 618 is able to mend the broken region around the corner 615. Because the repair conductive layer 620 is only a layer for repairing the cathode layer 618 so that the conductive current carrying capacity and light emitting mechanism are resumed, the repair conductive layer 620 need not be too thick.

In addition, other methods of forming a repair conductive layer 620 over the cathode layer 618 to repair a broken cathode layer are also possible. For example, the repair conductive layer 620 is formed over the cathode layer 618 by conducting a thermal evaporation-deposition process or electron beam evaporation-deposition process before a sputtering process.

According to this invention, the method of preventing the cathode of an active matrix organic light emitting diode from breaking includes planarizing the passivation layer, forming a photosensitive layer over the passivation layer to smooth out the surface or using a special etching method to round off the corners of the source/drain terminals. All these methods are capable of preventing subsequently formed cathode layer from breaking. Furthermore, this invention also provides a method of repairing a broken cathode layer so that the device may be re-used.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of preventing cathode break in an active matrix organic light emitting diode device through a process of rounding the corners of the source/drain terminal of a thing film transistor, the method comprising:

forming a conductive layer over a substrate; and conducting an etching operation to form the source/drain pattern of the thin film transistor, where the source/drain pattern has a sloping profile at each end, and the step of forming the source/drain pattern comprising forming a patterned first photoresist layer over the conductive layer;

conducting a first etching operation using the first photoresist layer as an etching mask to remove a definite thickness of the conductive layer;

removing a definite thickness from the first photoresist layer to form a second photoresist layer; and conducting a second etching operation using the second photoresist layer as an etching mask to form the source/drain pattern.

2. The method of claim 1, wherein the step of removing a definite thickness of the first photoresist layer includes conducting an ashing operation using oxygen plasma.

* * * * *